United States Patent [19]

Smeltz, Jr.

[11] Patent Number: 4,922,325

[45] Date of Patent: May 1, 1990

[54] MULTILAYER CERAMIC PACKAGE WITH HIGH FREQUENCY CONNECTIONS

[75] Inventor: Palmer D. Smeltz, Jr., Ruscombmanor Township, Berks County, Pa.

[73] Assignee: American Telephone and Telegraph Company, New York, N.Y.

[21] Appl. No.: 104,719

[22] Filed: Oct. 2, 1987

[51] Int. Cl.⁵ .................. H01L 23/02; H01L 23/12
[52] U.S. Cl. ........................... 357/74; 357/80; 174/266; 372/36
[58] Field of Search .......... 357/80, 74; 174/68.5; 372/36

[56] References Cited

U.S. PATENT DOCUMENTS

| | | | |
|---|---|---|---|
| 4,309,717 | 1/1982 | Cardinal | 357/74 |
| 4,417,392 | 11/1983 | Ibrahim | 29/840 |
| 4,430,365 | 2/1984 | Schaible et al. | 427/96 |
| 4,577,214 | 3/1986 | Schaper | 357/74 |
| 4,649,417 | 3/1987 | Burgess et al. | 357/74 |
| 4,667,220 | 5/1987 | Lee et al. | 357/74 |
| 4,713,634 | 12/1987 | Yamamura | 357/74 |
| 4,725,878 | 2/1988 | Miyauchi et al. | 357/74 |
| 4,809,058 | 2/1989 | Funamoto et al. | 357/81 |
| 4,811,082 | 3/1989 | Jacobs et al. | 357/80 |

*Primary Examiner*—Rolf Hille
*Assistant Examiner*—Hoanganh Le
*Attorney, Agent, or Firm*—Wendy W. Koba

[57] ABSTRACT

A multilayer ceramic package is disclosed which includes a high frequency interconnect that simulates the performance of a conventional coaxial connector. The interconnect comprises a signal conductor surrounded by the ceramic material forming the package. A plurality of vias are formed through the ceramic material so as to surround the conductor. These vias are then connected to a ground plane to form the outer shielding for the high frequency interconnect.

20 Claims, 4 Drawing Sheets

MULTILAYER CERAMIC PACKAGE WITH HIGH FREQUENCY CONNECTIONS

BACKGROUND OF THE INVENTION

1. Technical Field

The present invention relates to a multilayer ceramic (MLC) package and, more particularly, to a multilayer ceramic package with a high frequency connector which simulates a conventional coaxial connector.

2. Description of the Prior Art

Multilayer ceramic packages have become popular design choices for a variety of devices, including integrated circuits, microwave circuits, and optoelectronic devices. Multilayer ceramic packages are usually formed of a material including alumina which can be sintered at the end of the packaging process to form a hermetic package. The use of a multilayer ceramic package to house a lightwave transmitting device is discussed in copending application Ser. No. 008,051, filed Jan. 15, 1987 and assigned to the assignee of the present application. The package disclosed in the copending application advantageously utilizes the ceramic material forming the package wall to form a stripline interconnection between an external signal source and the laser diode housed within the package. The utilization of such a microwave connection provides a vast improvement over the prior art interconnection which included conductive strips inserted through the package wall.

Stripline connectors, however, do have limitations which become apparent at very high frequency (>4 GHz) applications. A stripline can be thought of as a coaxial connector, with the outer ground shielding layer cut and laid out flat to form a single ground plane. The remainder of the stripline structure consists of a dielectric layer covering the ground layer, and a signal path disposed over the dielectric. With this structure, there exists some signal loss, since a portion of the electric field emanating from the signal conductor will not be captured by the ground place. Additionally, this type of structure is susceptible to parasitic disturbances and cannot fully insulate the signal path from any other signals in the vicinity.

A true coaxial connector consists of a signal conductor completely surrounded by an insulating dielectric and the dielectric completely surrounded by the ground conductor. With this arrangement, signal loss is minimized, since all of the electric field emanating from the signal conductor remains confined in the dielectric. Additionally, a coaxial connector will electrically insulate the central signal path from any other signals in the vicinity.

One arrangement in the prior art which utilizes a coaxial conductor as a connector with a high frequency optical receiver is disclosed in U.S. Pat. No. 4,309,717 issued to R. E. Cardinal on Jan. 5, 1982. The Cardinal package, however, utilizes a coaxial connector with a metal package. In order to attach such a connector to a multilayer ceramic package, both the outside and inside walls of the package must be metallized so that the connector can be soldered to the package. This is a difficult task to perform, and as a result, this type of connector is not normally utilized with a MLC package.

Therefore, a need remains in the prior art for some means of including a coaxial-quality high frequency connector with a multilayer ceramic package.

SUMMARY OF THE INVENTION

The need remaining in the prior art is addressed by the present invention which relates to a multilayer ceramic package with a high-frequency connector and, more particularly, to such a MLC package including a high frequency connection which simulates a conventional coaxial connector.

In accordance with the present invention, a coaxial-like connector is formed from a section of multi-layer ceramic by including two pluralities of spaced-apart, parallel vias extending between coplanar ground planes. A sufficient number of vias are formed so as to simulate the formation of a pair of conductive walls extending between the pair of parallel ground planes. The signal conductor is formed on one of the ceramic layers in the central region of the ground plane structure.

In one embodiment of the present invention, the vias on adjacent ceramic layers may be staggered to form a more circular-like connection between the bottom ground plane and the top ground plane to more closely imitate the conventional coaxial-type connector.

An alternative embodiment of the present invention utilizes vias which are formed in such a pattern through the surface of the dielectric such that the connection may comprise any desired shape, for example, a right-angled path or an arched path. This embodiment is useful when the high frequency connector must turn a corner between the signal source and the transmitting device.

Yet another embodiment of the present invention relates to the formation of a high frequency connector through the bottom of a ceramic dual-in-line package (DIP). In a ceramic DIP, one of the pins may connect to a high frequency signal source, where vias are formed to surround the pin and provide ground plane shielding.

It is an aspect of the present invention to control the quality of the ground plane shielding by controlling the number of vias used to form the connection between the ground planes. That is, increasing the number of vias to improve the quality of the shielding. Indeed, in the limit, adjacent vias may be formed to overlap so that the ground plane shielding will take the form of one continuous section of conductive material.

Another aspect of the present invention is to provide a coaxial-like connector which may be formed as either a through-the-wall connector between an external signal source and the various components within the MLC package, or, alternatively, as a fully internal connector residing completely within the MLC package.

The various attributes of the present invention will become readily apparent from a reading of the following description and by reference to the accompanying drawings.

BRIEF DESCRIPTION OF THE DRAWING

Referring now to the drawings, where like numerals represent like parts in several views.

DETAILED DESCRIPTION

Figure 1:
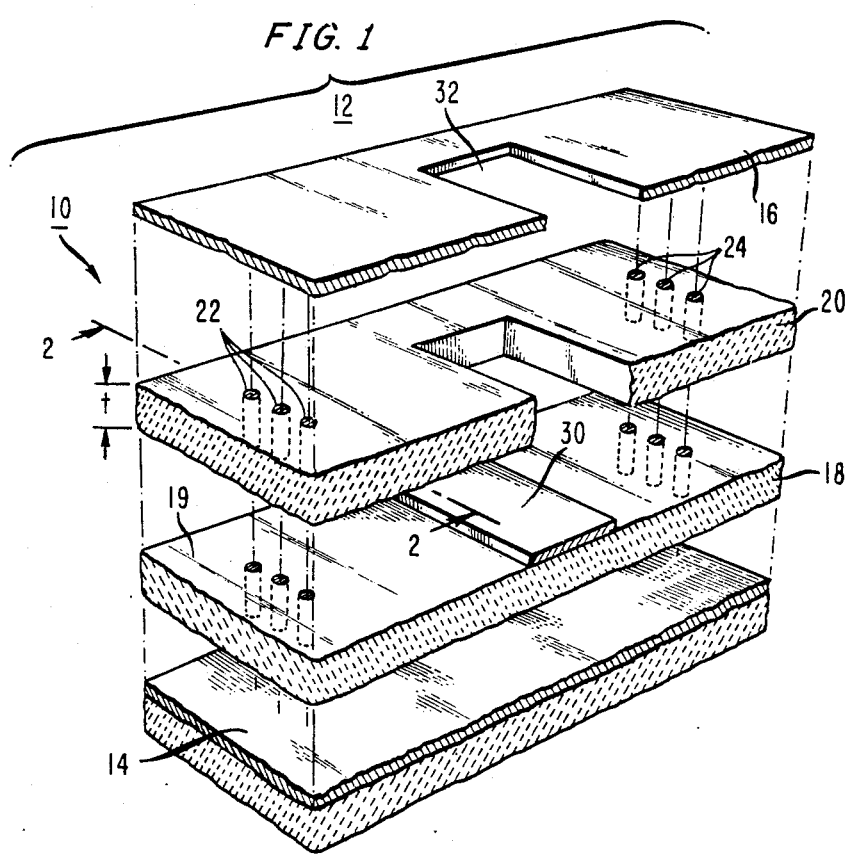
FIG. 1 illustrates, in an exploded view, a multi-layer ceramic package including a high-frequency connector of the present invention.

FIG. 1 illustrates, in an exploded view, an exemplary multilayer ceramic package including a high-frequency connector 10 formed in accordance with the present invention. An outer ground conductor 12 of connector 10 includes, as shown in FIG. 1, a bottom ground plane 14 and a top ground plane 16, separated by a pair of ceramic layers 18 and 20, ceramic layers 18 and 20 being a portion of a multilayer ceramic package. It is to be noted that the number of ceramic layers separating ground planes 14 and 16, as well as their relative thickness t, is a matter of design choice, where only two such layers are illustrated in FIG. 1 for the sake of simplicity.

Ground planes 14 and 16 are electrically connected to form outer ground conductor 12 by two pluralities of vias 22 and 24, which extend through ceramic layers 18 and 20. The use of vias 22,24 thus form a pair of walls to complete the ground conductor structure. In a simplified visualization, ground conductor 12 may be thought of as a cage-like box, with vias 22,24 forming bars on opposing sides of the box. A signal conductor 30 comprises a smaller metal strip formed in a central region of ground conductor 12. In the exemplary embodiment of FIG. 1, signal conductor 30 is illustrated as disposed between ceramic layers 18 and 20. In practice, conductor 30 may be directly deposited on top surface 19 of ceramic layer 18. Coupling of connector 10 to a high frequency signal source (not shown) is provided by removing sections of ceramic layer 20 and top ground plane 16 to form an opening 32 above signal conductor 30, as illustrated in FIG. 1.

Figure 2:
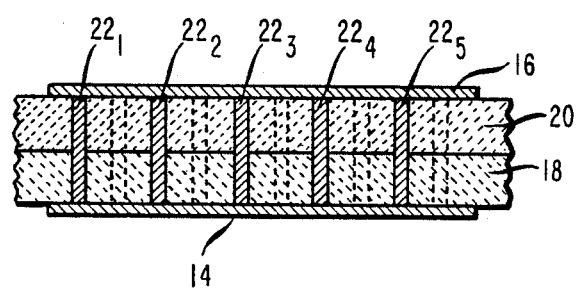
FIG. 2 illustrates a side view of the package of FIG. 1 illustrating the relationship between the vias of adjacent ceramic layers.

As stated above, it is necessary to form pluralities of vias 22,24 so as to simulate the formation of a pair of walls of conductive material between ground planes 14 and 16. The formation of such walls is clearly shown in FIG. 2, which is a section of connector 10 of FIG. 1 taken along line 2-2. In this particular embodiment, a plurality of five vias, subscripted as noted, is utilized to form via set 22. It is obvious that the simulation is improved by increasing the number of vias. Additional vias are illustrated in phantom in FIG. 2.

Figure 3:
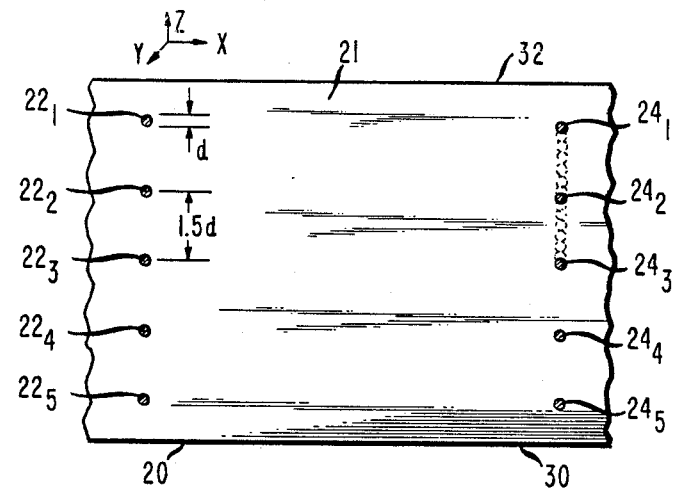
FIG. 3 illustrates a plan view of the arrangement of FIG. 1, with the top ground plane removed.

FIG. 3 illustrates a plan view of connector 10 of FIG. 1 which exposes top major surface 21 of ceramic layer 20. Each via may have a diameter d of, for example, 0.010 inches, with adjacent vias separated by an appropriately small distance. Care must be taken with some types of ceramic material so it is not stressed or cracked when forming the vias. Separating the vias by a distance equal to 1.5 times its diameter has been found to avoid this cracking problem with some materials. As improvements in ceramic material are made, it may be possible to form the vias in an overlapping pattern (as shown in phantom in FIG. 3), creating one continuous section of conductive material. This pattern is thought to achieve the best ground plane. As seen by reference to FIG. 3, the vias in this exemplary arrangement are disposed in a linear arrangement along the Z-axis. Thus, connector 10 can be likened to utilizing a straight piece of coaxial connecting cable, with the associated interconnections to a high frequency signal source (not shown) and a transmitting device (not shown) formed at front face 30 and rear face 32 of connector 10.

Figure 4:
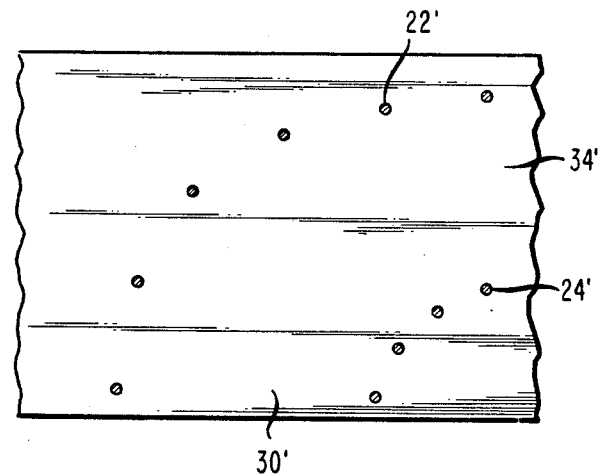
FIG. 4 illustrates a plan view of an alternative embodiment of the present invention utilizing vias formed in an arched pattern.

In contrast, the vias may be disposed in any desired pattern, just as coaxial cable may be bent to form any desired physical shape. FIG. 4 illustrates a plan view of one such alternative disposition of vias, where vias 22' and 24' form a pattern which curves, or arches, to the right, forming an interconnection between front face 30' and a side face 34'. It is clear from this arrangement that the spacing between adjacent vias may be adjusted to provide the desired curving shape. Various alternative arrangements, including but not limited to, right- and left-angled connections, and leftward arches are also possible.

Figure 5:
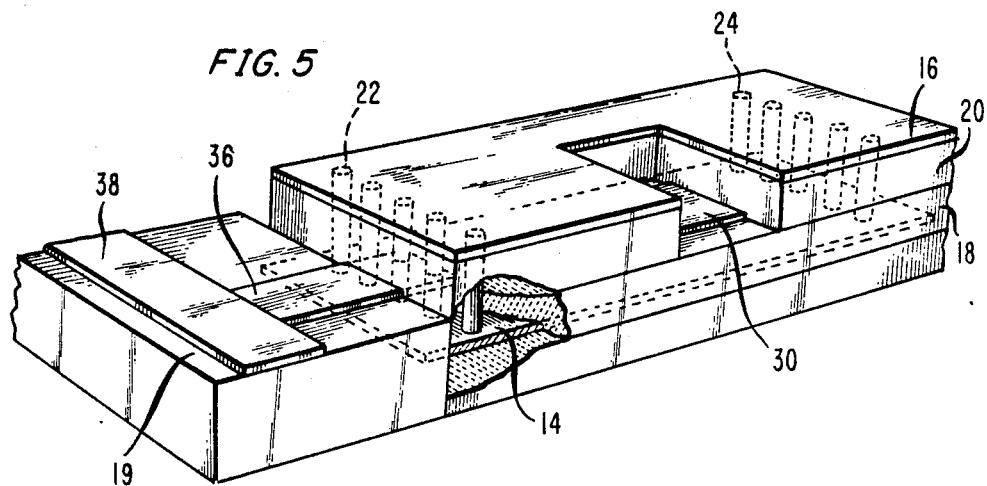
FIG. 5 illustrates the connector of FIG. 1 with the top ground plane layer removed to illustrate an exemplary interconnection arrangement which is possible with the connector of the present invention.

An advantage of the coaxial structure of the present invention is that connections to both the ground plane and the signal path may be made at the same level in the ceramic. This advantage is illustrated in FIG. 5. In particular, connection to ground conductor 12 may be formed to coincide with top surface 19 of ceramic layer 18, the same surface upon which signal conductor 30 is formed. This is accomplished in accordance with the present invention by forming an interconnection metal strip 36 along top surface 19 of ceramic layer so as to contact one or more of the vias passing through ceramic layer 18. For the exemplary arrangement shown in FIG. 5, interconnection metal strip 36 is illustrated as contacting both vias $22_2$ and $22_3$. It is to be understood that such an interconnection strip could be formed on the opposite side of connector 10, so as to contact one or more vias 24. Final electric connection may be provided by a ground connection strip 38 which contacts interconnection strip 36 and runs parallel to signal conductor 30. It is to be noted, however, that interconnection strip 36 may also serve as the ground plane connector.

Figure 6:
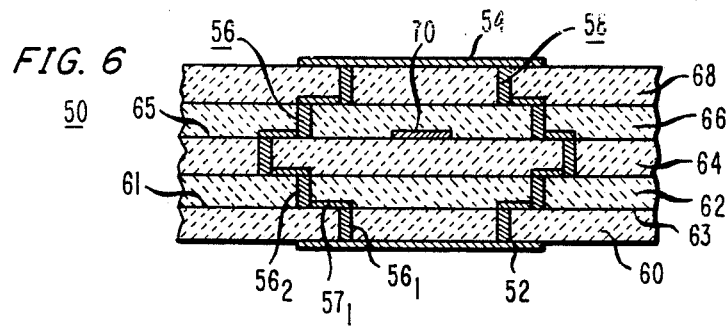
FIG. 6 illustrates an alternative embodiment of the connector of the present invention, with staggered vias utilized to simulate a rounded coaxial connector.

FIG. 6 illustrates, in a cross-sectional view, an alternative embodiment of the present invention which may be utilized when it is desired to stagger the vias to form a more rounded coaxial-like structure. Connector 50 of FIG. 6 includes, similarly to connector 10 of FIG. 1, a bottom ground plane 52 and a top ground plane 54, connected by first and second pluralities of vias 56 and 58, respectively. Ground planes 52 and 54 are separated by a plurality of ceramic layers, illustrated in FIG. 6 as a set of five ceramic layers 60, 62, 64, 66, and 68. Signal conductor 70 is illustrated as formed on a top surface 65 of ceramic layer 64 so as to be approximately centrally disposed within the ground conductor structure.

Figure 7:
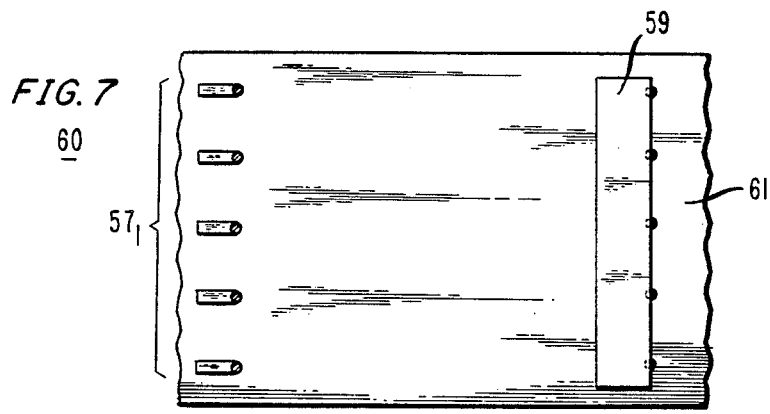
FIG. 7 illustrates a plan view of the embodiment of FIG. 6, illustrating two exemplary types of electrical connections which may be used to connect the vias associated with adjacent ceramic layers.

As shown in FIG. 6, the set of vias formed within each ceramic layer are joined to those formed through the adjacent ceramic layer by metal connections formed over the top (or bottom) surface of the adjacent ceramic. In particular, vias $56_1$ formed through ceramic layer 60 are joined to vias $56_2$ formed through ceramic layer 62 by a set of horizontal connections $57_1$, formed across top surface 61 of ceramic layer 60 (or alternatively, across bottom surface 63 of ceramic layer 62). In this staggered configuration, either separate metal connections 57, or a single metal strip 59, as shown in FIG. 7, may be used to join contiguous vias.

Figure 8:
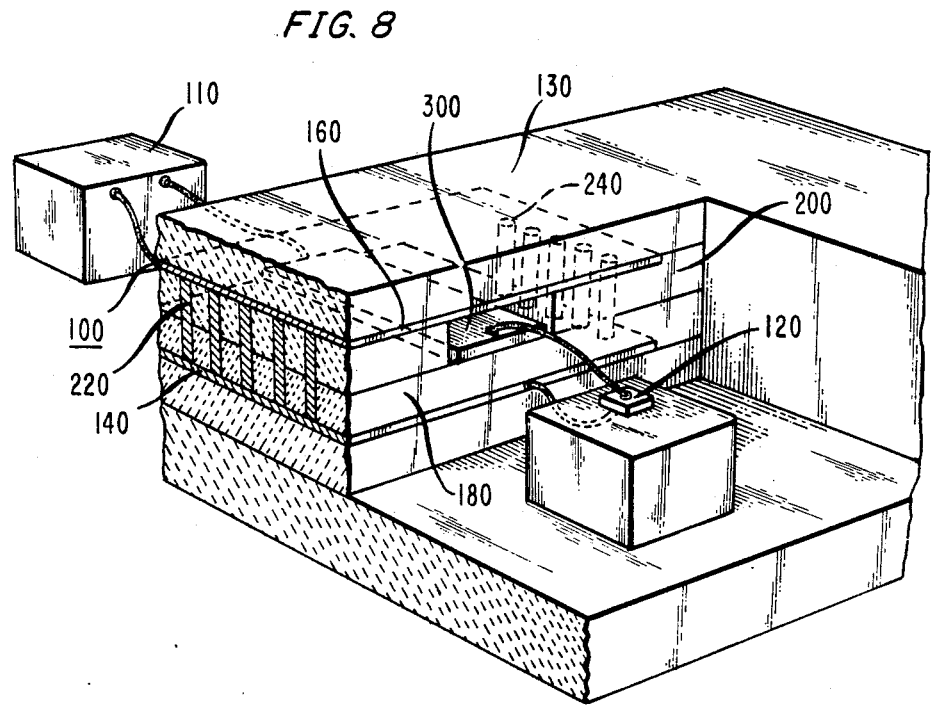
FIG. 8 illustrates an exemplary ceramic package of the present invention utilizing a through-the-wall high frequency connector for coupling an external signal source to a transmitting device located within the ceramic package.

As mentioned above, the high frequency connector of the present invention may be used with many different multilayer ceramic package arrangements. A first type of package is illustrated in FIG. 8. As shown, this particular ceramic package utilizes a "through-the-wall" high frequency connector 100 for coupling an external signal source 110 to a transmitting device 120 encased within a package 130. For example, device 120 may be a semiconductor laser. Connector 100 includes first and second ground planes 140 and 160, separated by a plurality of ceramic layers 180 and 220. Two pluralities of vias 220 and 240, are utilized to connect ground planes 140 and 160. Signal conductor 300 is centrally disposed, as shown, within the dielectric material.

Figure 9:
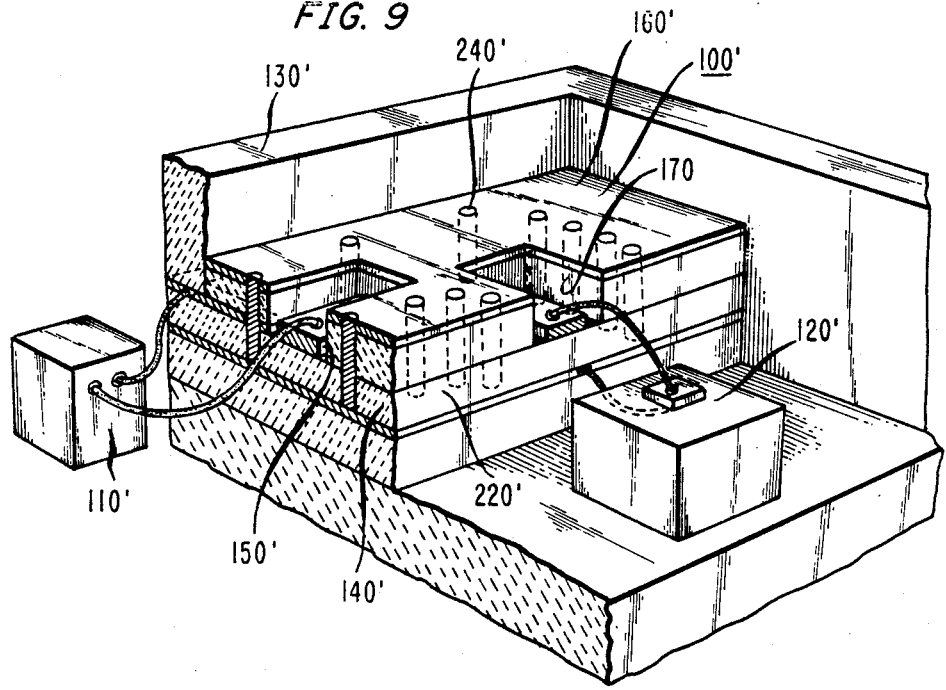
FIG. 9 illustrates an alternative ceramic package of the present invention utilizing a high frequency connector which is completely encased within the package for connecting an internal signal source to a transmitting device.

An alternative embodiment of a package utilizing the connector of the present invention is illustrated in FIG. 9. In this particular embodiment, connector 100' is fully contained within package 130'. In this manner, connector 100' may consist of sections 140' and 160' of the material forming the walls of the ceramic package 130' or, alternatively, connector 100' may comprise separate pieces of ceramic which are positioned inside package 130'. This particular embodiment is utilized when it is desired to location the signal source 110' inside the package with the transmitting device 120'. As shown in the configuration of FIG. 9, the vias 220' and 240' are disposed in a curved configuration, with signal source 110' coupled to connector 100' at front face 150 and transmitting device 120' coupled to connector 100' at side face 170.

Figure 10:
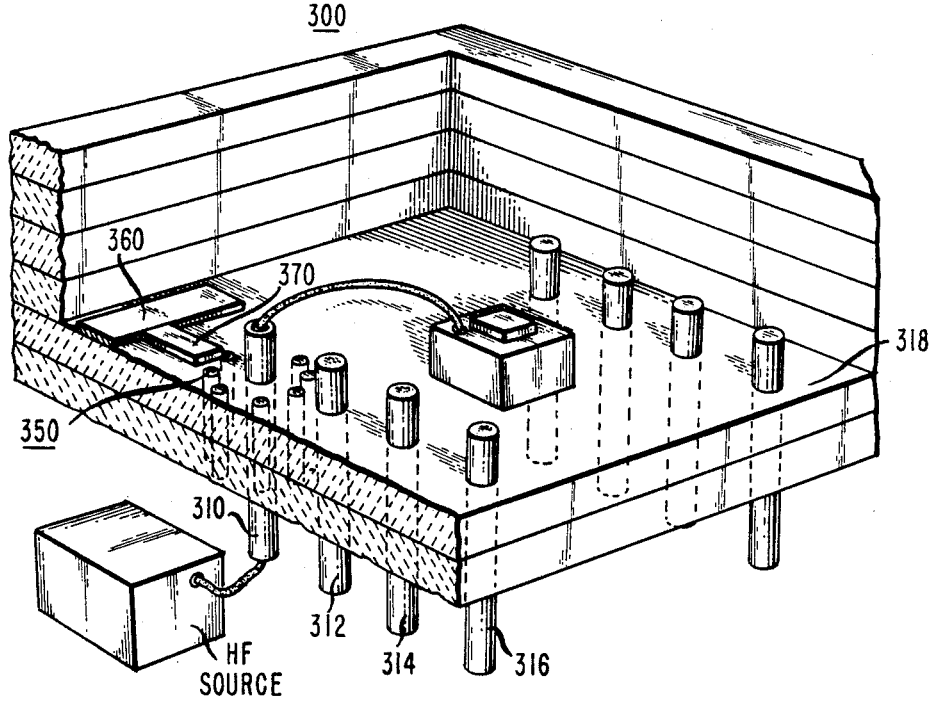
FIG. 10 illustrates yet another embodiment of the present invention, utilizing the novel high frequency connector with a dual-in-line package (DIP) arrangement.

The uses of the high frequency coaxial-like connector of the present invention are not limited to the specific package designs discussed above. For example, the inventive high frequency connector may be formed as part of a dual-in-line package (DIP) similar to that illustrated in FIG. 10. In this particular embodiment, a DIP 300 includes a plurality of connecting pins 310, 312, 314 and 316 which extend through bottom surface 318 of package 300. Pin 310 is defined in this example to be the connection between an external high frequency signal source 320 and an internal device 330, perhaps a high frequency laser or LED. In accordance with the teachings of the present invention, a plurality of vias 350 are formed through bottom surface 318 of package 300 to surround pin 310 and form outer ground plane 340. A metallic strip 360 is utilized to connect the vias to some internal ground, or package ground (not shown). In this particular embodiment, vias 350 are disposed in a circular fashion since this particular arrangement most closely simulates the conventional coaxial-type connector than the previous embodiments. However, any suitable arrangement of vias may be utilized (square pattern, rectangular pattern, for example) so long as pin 310 is completely surrounded by vias. As long as the material forming package 300 is non-conductive, this type of high frequency connector may be formed. It is to be understood that there are many other types of packages which may utilize the coaxial-like high frequency connector of the present invention which are possible that have not been enumerated or illustrated here.

What is claimed is:

1. A ceramic package including a high frequency connector, said high frequency connector comprising
   a signal conductor including a first end and a second end for providing a signal path between a first device, respectively;
   ceramic material disposed to surround the signal conductor such that the first and the second ends remain exposed;
   a plurality of vias formed through the ceramic material so as to enclose said signal conductor; and
   grounding means coupled to the plurality of vias to form, in combination with said plurality of vias, a ground plane insulator for said signal conductor.

2. A ceramic package as defined in claim 1 wherein the grounding means comprises
   a first layer of conductive material; and
   a second layer of conductive material disposed in a parallel relationship with the first layer; and
   the plurality of vias comprises
   a first set of vias formed through the ceramic material so as to form a first electrical connection between the first conductive layer and the second conductive layer;
   a second set of vias formed through said ceramic material so as to form a second electrical connection between said first conductive layer and said second conductive layer, the first and second sets of vias disposed in a spaced-apart relationship such that the signal conductor is contained within the region bounded by said grounding means and said plurality of vias and the signal path along said signal conductor is parallel with said first and second conductive layers.

3. The ceramic package of claim 2 wherein said package comprises a plurality of separate ceramic layers and the signal conductor comprises a strip of conductive material disposed longitudinally along a major surface of one of said plurality of ceramic layers.

4. The multilayer ceramic package of claim 3 wherein each set of vias is formed in a staggered arrangement such that vias through adjacent ceramic layers are shifted to form a rounded profile high frequency interconnection when viewed along the direction of the signal path, the connector further comprising
   electrical connection means disposed between adjacent layers of ceramic material to provide electrical connection between adjacent vias of each set of vias.

5. The multilayer ceramic package of claim 4 wherein the electrical connection means comprises a plurality of conductive strips, each strip associated in a one-to-one relationship with each via of the plurality of vias.

6. The multilayer ceramic package of claim 4 wherein the electrical connection means comprises a single strip of conductive material disposed between adjacent layers of ceramic material so as to provide electrical contact between adjacent vias.

7. The multilayer ceramic package of claim 3 wherein each via comprises a predetermined diameter d, adjacent vias separated by a distance of 1.5d.

8. The multilayer ceramic package of claim 3 wherein each via comprises a predetermined diameter d, and adjacent vias are disposed in an overlapped pattern so that each set of vias essentially form a single section of conductive material between the major surfaces of each ceramic layer.

9. The ceramic package of claim 2 wherein each set of vias is disposed in a linear arrangement.

10. The ceramic package of claim 2 wherein each set of vias is disposed in a nonlinear arrangement.

11. The ceramic package of claim 1 wherein the high frequency connector is formed through a sidewall of said package to provide connection between the first device, located external to said package, and the second device, located internal to said package.

12. The ceramic package of claim 1 wherein the high frequency connector is wholly contained within said package to provide connection between a first device located within said package to a second device located within said package.

13. The ceramic package of claim 1 wherein the high frequency connector is formed through the bottom of said package and the signal conductor is disposed perpendicular to the package bottom, the plurality of vias formed parallel to said signal conductor and disposed to surround said signal conductor.

14. The ceramic package of claim 13 wherein the plurality of vias is disposed in a non-circular pattern around the signal conductor.

15. The ceramic package of claim 13 wherein the plurality of vias is disposed in a circular pattern around the signal conductor.

16. A laser transmitter housed in a ceramic package including a high frequency connector, said high frequency connector comprising a signal conductor including a first end and a second end for providing a signal path between a high frequency signal source and a laser;

ceramic material disposed to surround the signal conductor such that the first and the second ends remain exposed;

a plurality of vias formed through the ceramic material so as to enclose said signal conductor; and grounding means coupled to the plurality of vias to form, in combination with said plurality of vias, a ground plane insulator for said signal conductor.

17. A ceramic package as defined in claim 16 wherein the grounding means comprises a first layer of conductive material; and a second layer of conductive material disposed in a parallel relationship with the first layer; and the plurality of vias comprises a first set of vias formed through the ceramic material so as to form a first electrical connection between the first conductive layer and the second conductive layer;

a second set of vias formed through said ceramic material so as to form a second electrical connection between said first conductive layer and said second conductive layer, the first and second sets of vias disposed in a spaced-apart relationship such that the signal conductor is contained within the region bounded by said ground means and said plurality of vias and the signal path along said signal conductor is parallel with said first and second conductive layers.

18. The ceramic package of claim 17 wherein the high frequency connector is formed through a sidewall of said package to provide connection between the first device, located external to said package, and the second device, located internal to said package.

19. The ceramic package of claim 17 wherein the high frequency connector is wholly contained within said package to provide connection between a first device located within said package to a second device located within said package.

20. The ceramic package of claim 17 wherein the high frequency connector is formed through the bottom of said package and the signal conductor is disposed perpendicular to the package bottom, the plurality of vias formed parallel to said signal conductor and disposed to surround said signal conductor.

* * * * *